United States Patent [19]

Miwada

[11] Patent Number: 5,223,725
[45] Date of Patent: Jun. 29, 1993

[54] CHARGE TRANSFER DEVICE EQUIPPED WITH JUNCTION TYPE OUTPUT TRANSISTOR IMPROVED IN SENSITIVITY TO CHARGE PACKET

[75] Inventor: Kazuo Miwada, Tokyo, Japan
[73] Assignee: NEC Corporation, Japan
[21] Appl. No.: 965,222
[22] Filed: Oct. 23, 1992
[30] Foreign Application Priority Data
Nov. 11, 1991 [JP] Japan .................. 3-294660
[51] Int. Cl.[5] .................. H01L 29/78; G11C 19/28
[52] U.S. Cl. .................. 257/239; 257/222; 257/262; 257/271; 257/285; 257/286; 377/60
[58] Field of Search .............. 257/222, 239, 262, 271, 257/285, 286; 377/60

[56] References Cited
U.S. PATENT DOCUMENTS 3,918,070 11/1975 Shannon .................. 257/239
4,074,302 2/1978 Brewer .................. 257/239
4,672,645 6/1987 Bluzer .................. 377/60

Primary Examiner—Gene M. Munson
Attorney, Agent, or Firm—Laff, Whitesel, Conte & Saret

[57] ABSTRACT

A charge transfer device is equipped with a junction type field effect transistor coupled with the final stage of a transfer shift register for modulating current flowing therethrough depending upon the amount of electric charge from the transfer shift register, and the junction type field effect transistor comprises an n-type looped gate region formed in a p-type well, a p-type source region surrounded by the looped gate region, a p-type drain region opposite to the source region with respect to the looped gate region, and a p-type channel region defined in the p-type well beneath the looped gate region, wherein the p-type channel region is shallower or smaller in dopant concentration than remaining portion of the p-type well so that the current is effectively modulated with the electric charge.

12 Claims, 10 Drawing Sheets

CHARGE TRANSFER DEVICE EQUIPPED WITH JUNCTION TYPE OUTPUT TRANSISTOR IMPROVED IN SENSITIVITY TO CHARGE PACKET

FIELD OF THE INVENTION

This invention relates to a charge transfer device and, more particularly, to an output stage of the charge transfer device.

DESCRIPTION OF THE RELATED ART

A typical example of the output stage incorporated in a prior art charge transfer device is illustrated in FIGS. 1, 2 and 3. The prior art charge transfer device is fabricated on a lightly doped n-type silicon substrate 1, and a p-type well 2 is defined in the surface portion of the n-type silicon substrate 1. A heavily doped p-type isolating region 3 defines an active area, and a thick field oxide film 4 is selectively grown over the heavily doped p-type isolating region 3. The active area is assigned to an n-type transfer channel region 5a, an n-type looped region 5b contiguous to the n-type transfer region 5a, a heavily doped p-type source region 5c surrounded by the looped region 5b, an n-type buried channel region 5d contiguous to the looped region 5b and a reset drain region 5e also contiguous to the buried channel region 5d.

A thin silicon oxide film 6 covers the active area, and gate electrodes 7a, 7b, 7c and 7d are provided on the thin silicon oxide film 6. Namely, the gate electrodes 7a and 7b are partially overlapped with each other, and a multi-phase transfer clock signal is sequentially applied to the gate electrodes for conveying charge packets along the n-type transfer region 5b. The gate electrode 7c is also overlapped with the gate electrode 7b, and allows the charge packets to flow into the n-type looped region 5b. The gate electrodes 7a, 7b and 7c, the thin silicon oxide film 6 and the n-type transfer region 5a as a whole constitute a charge transfer register 8, and the charge transfer register 8 is coupled with photo-electric converting elements (not shown).

Although the gate electrodes 7a to 7d are covered with an insulating film 9, the insulating film 9 is removed from the layout shown in FIG. 1 for the sake of simplicity. The heavily doped p-type source region 5c is coupled with a junction type load transistor 10 which in turn is coupled with a power source 11. The drain node of the junction type load transistor 10 is coupled with an output buffer circuit 12. The n-type looped region 5b serves as a looped junction gate, and the p-type well 2 and the heavily doped isolating region 3 provide a conductive channel and a drain, respectively. Therefore, the heavily doped p-type source region 5c, the n-type looped region 5b, the p-type well 2 and the heavily doped isolating region 3 as a whole constitute a junction type field effect transistor 13 as will be better seen from FIG. 3. The junction type field effect transistor 13 thus arranged is responsive to the charge packet supplied from the charge transfer register 8 to the n-type looped region 5b, and the depletion layer extending into the p-type well 2 changes the channel conductivity depending upon the amount of the charge packet. As a result, the amount of hole current 15 is varied depending upon the channel conductivity, and the voltage level at the input node of the output buffer circuit 12 is, accordingly, varied. The n-type looped region 5d further serves as a source, and forms an n-channel type reset transistor 14 together with the gate electrode 7d, the thin silicon oxide film 6 and the reset drain region 5e. The junction type field effect transistor 13, the reset transistor 14, the junction type load transistor 10, the power source 11 and the output buffer circuit 12 as a whole constitute an output stage.

The prior art charge transfer device thus arranged behaves as follows. When the photo-electric converting elements are coupled with the charge transfer register 8, the photo-electric converting elements supply the charge packets each indicative of the intensity of image carrying light to the charge transfer register 8. The charge transfer register 8 conveys the charge packets toward the n-type looped region 5b in synchronism with the multi-phase charge transfer clock signal, and the charge packets sequentially flow into the n-type looped region 5b. Each charge packet changes the potential level in the looped region 5b, and the n-type looped region 5b modulates hole current 15 passing through the junction type field effect transistor 13. When the hole current 15 is modulated, the voltage level at the drain node of the junction type load transistor 10 is varied, and the output buffer circuit 12 detects the variation of the voltage level. The variation of the voltage level depends upon the amounts of electric charges of the charge packets, and is, accordingly, indicative of variation of the intensity of the image carrying light.

However, a problem is encountered in the prior art charge transfer device in that the output stage is less sensitive to the variation of the charge packets.

SUMMARY OF THE INVENTION

It is therefore an important object of the present invention to provide a charge transfer device which is improved in sensitivity to electric charges.

The present inventor analyzed the low sensitivity of the prior art charge transfer device, and concluded that the channel of the junction type field effect transistor 13 was too wide to effectively modulate the hole current 15.

To accomplish the object, the present invention proposes to increase channel resistance of a junction type field effect transistor for increasing the transconductance.

In accordance with the present invention, there is provided a charge transfer device fabricated on a semiconductor substrate of a first conductivity type, comprising: a) a shift register having an output node, and responsive to a transfer clock signal for transferring charge packets to the output node; and b) an output circuit having b-1) a current source, b-2) a load means having an input node coupled with the current source, and b-3) a junction type field effect transistor coupled with an output node of the load means, and formed in a well of a second conductivity type opposite to the first conductivity type, the junction type field effect transistor having a gate region of the first conductivity type coupled with the output node of the shift register for allowing the charge packets to flow thereinto, a source region of the second conductivity type defined in the well, and coupled with the output node of the load means, a drain region of the second conductivity type defined in the well, and located in the opposite to the source region with respect to the gate region, and a channel region of the second conductivity type defined in the well beneath the gate region, and larger in resistance than a corresponding region in the well.

The channel region may be not only shallower but also smaller in dopant concentration than the remaining portion of the well, and another channel region may be either shallower or smaller in dopant concentration than the remaining portion of the well. If the gate region projects deep into the well, the channel resistance of the junction type field effect transistor is increased.

BRIEF DESCRIPTION OF THE DRAWINGS

The feature and advantages of the charge transfer device according to the present invention will be more clearly understood from the following description taken in conjunction with the accompanying drawings in which.

DESCRIPTION OF THE PREFERRED EMBODIMENTS

First Embodiment

Figure 1:
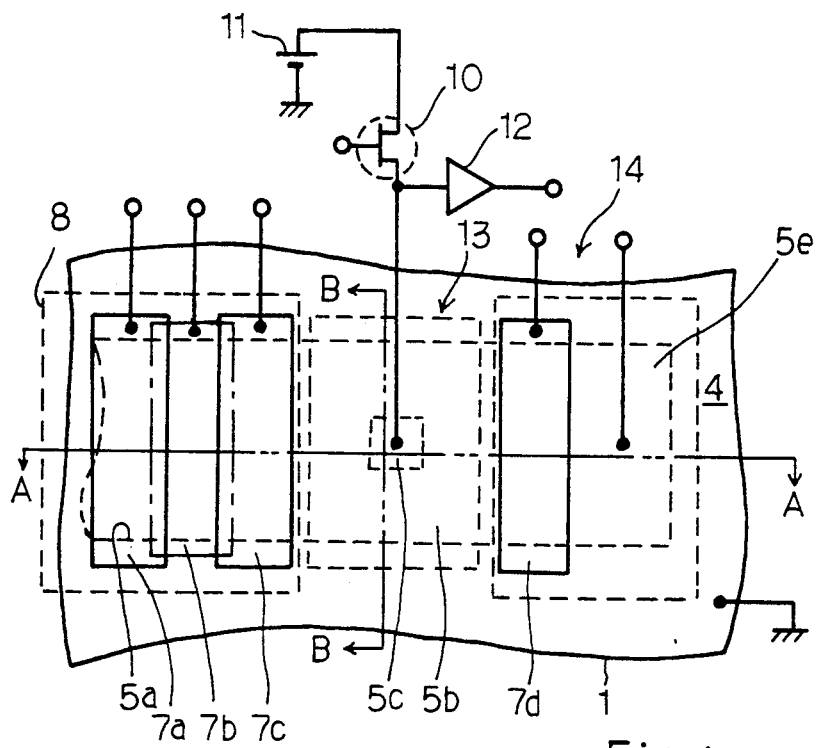
FIG. 1 a plan view showing the layout of the prior art charge transfer device.
Figure 2:
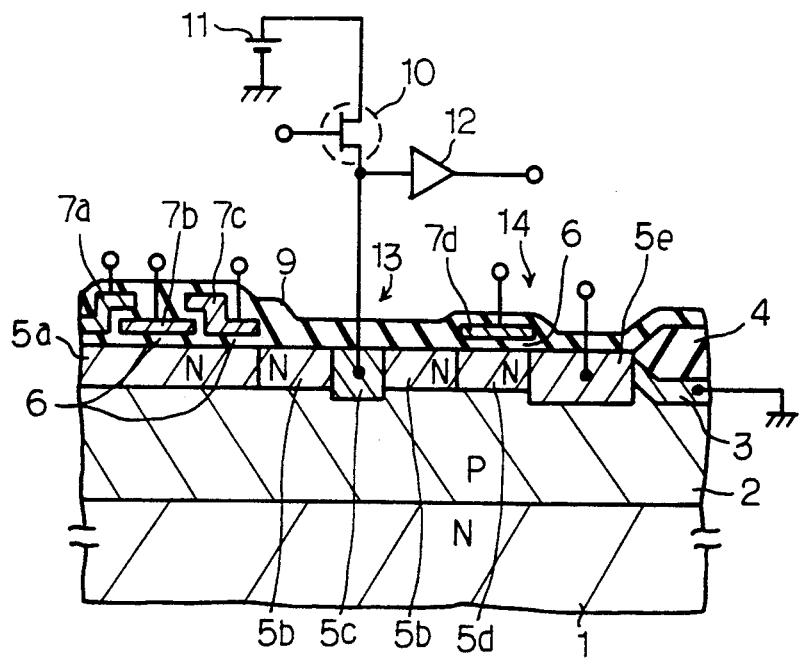
FIG. 2 is a cross sectional view taken along line A—A of FIG. 1 and showing the structure of the charge transfer device.
Figure 3:
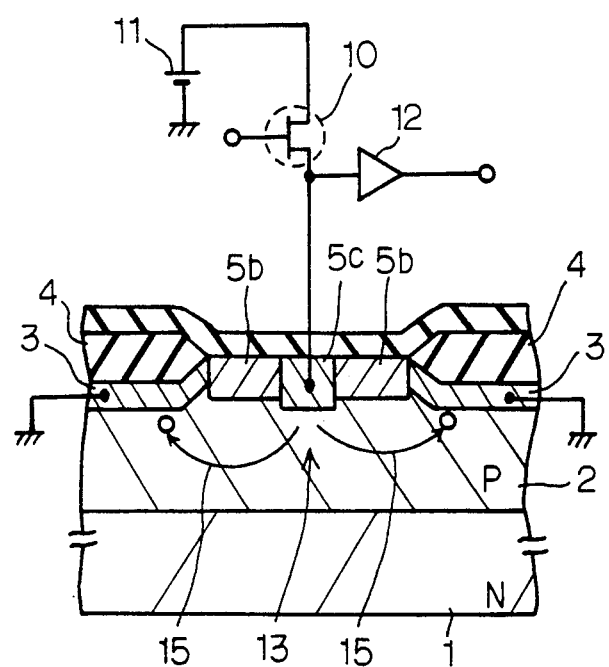
FIG. 3 is a cross sectional view showing the structure of the output stage of the prior art charge transfer device.
Figure 4:
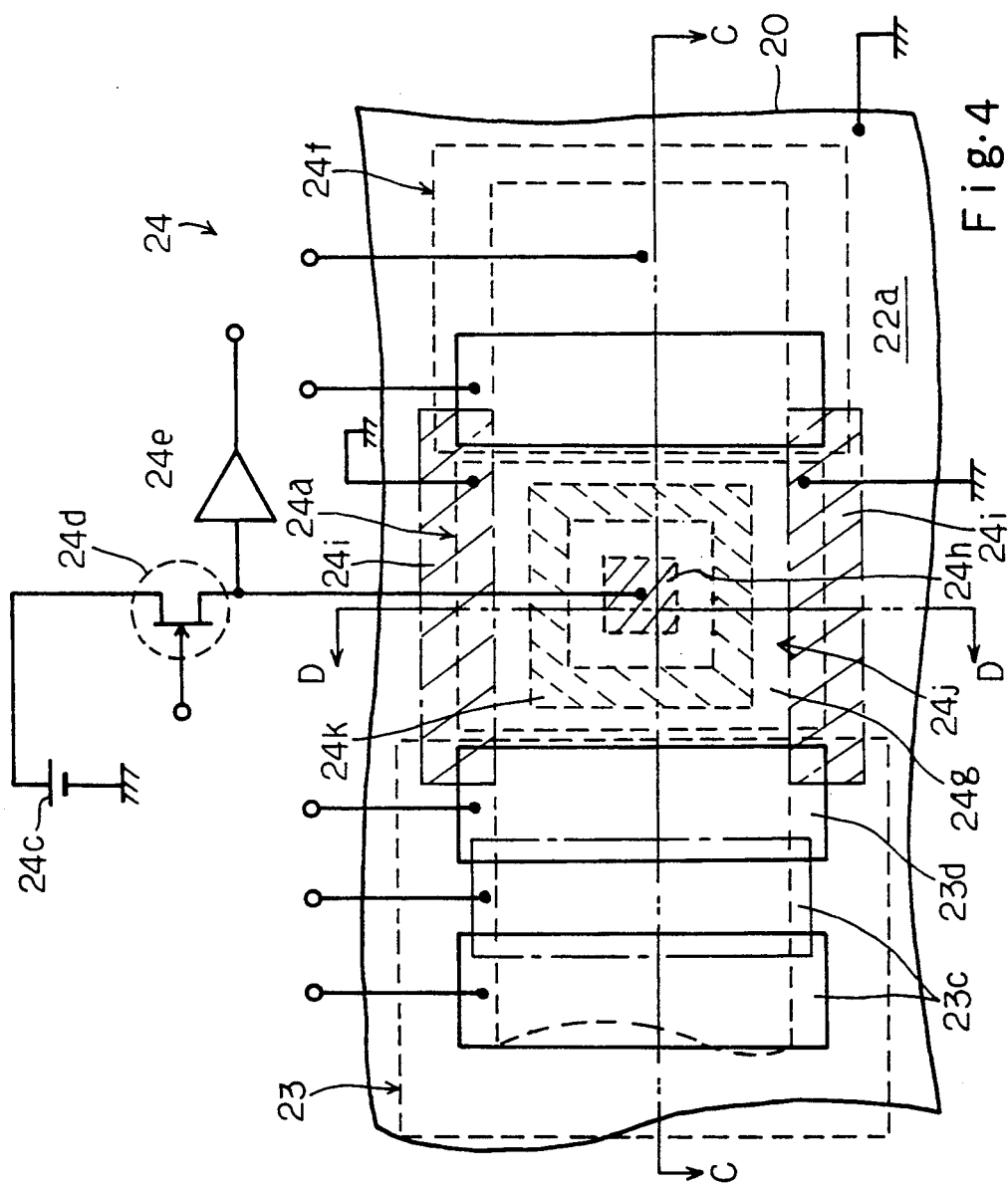
FIG. 4 is a plan view showing the layout of a charge transfer device according to the present invention.
Figure 5:
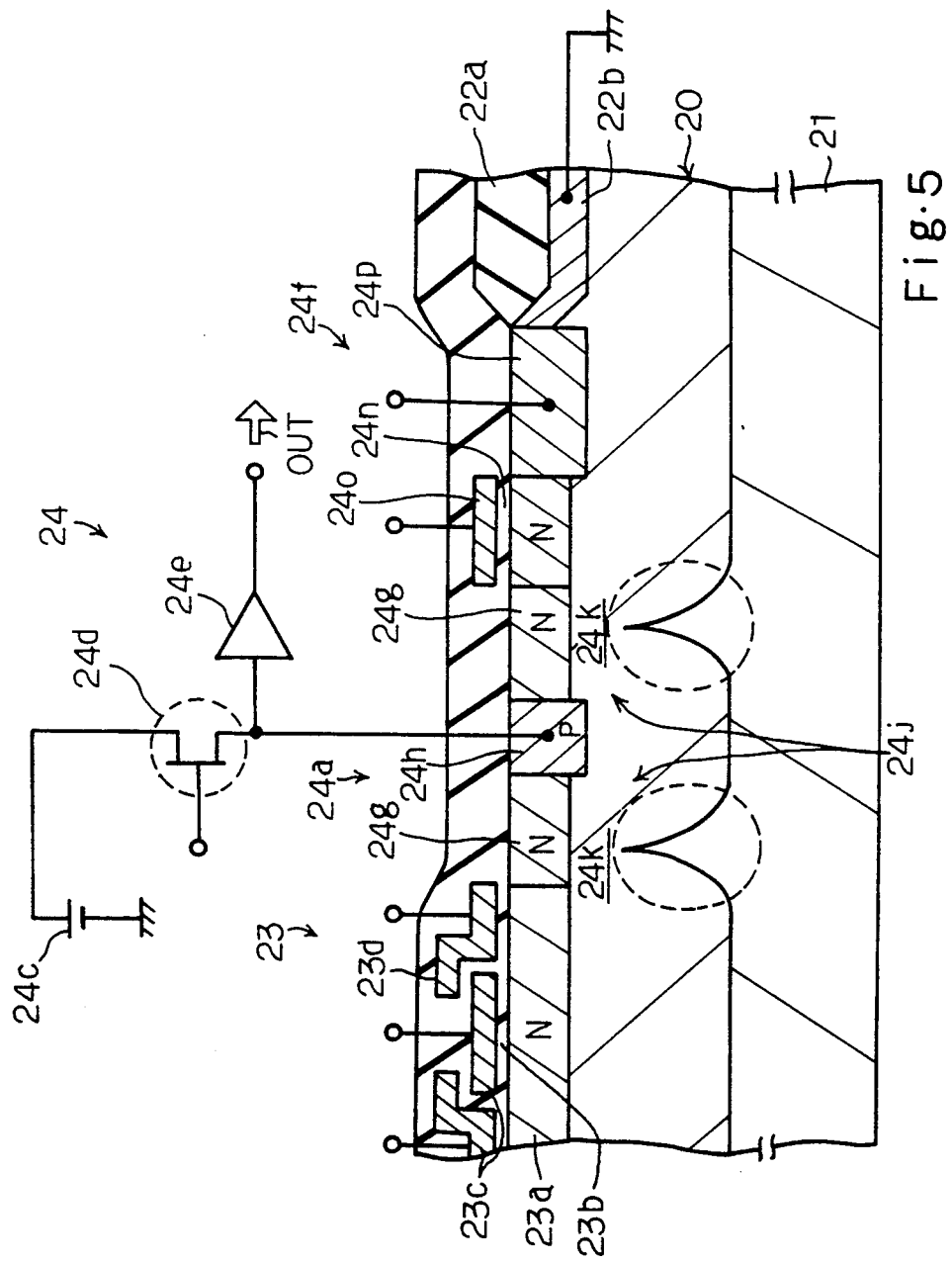
FIG. 5 is a cross sectional view taken along line C—C of FIG. 4 and showing the structure of the charge transfer device.
Figure 6:
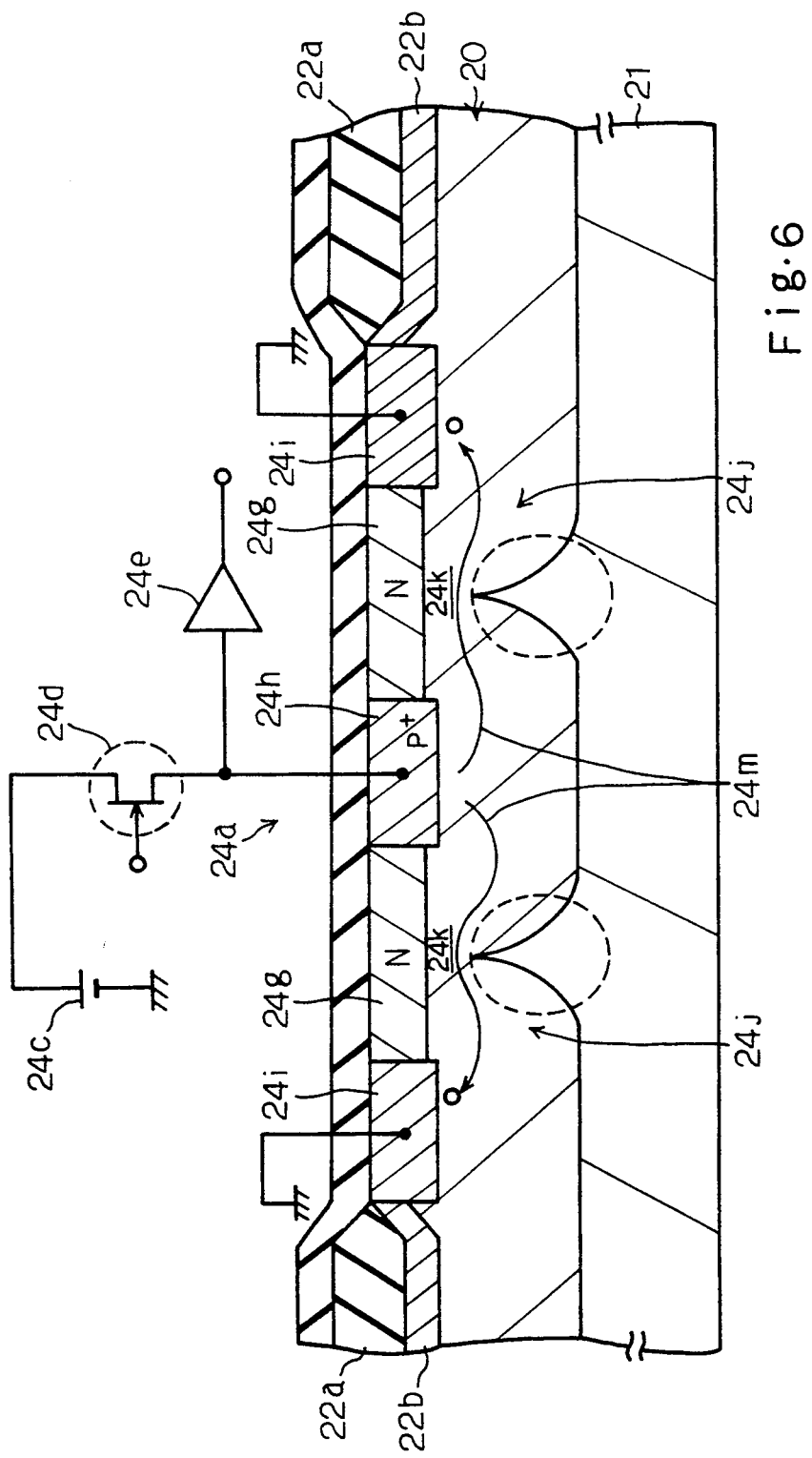
FIG. 6 is a cross sectional view taken along line D—D of FIG. 4 and showing the structure of the charge transfer device at different angle.

Referring to FIGS. 4 to 6 of the drawings, a charge transfer device embodying the present invention is fabricated on a p-type well 20 in an n-type semiconductor substrate 21, and a thick field oxide 22a is selectively grown for defining an active area. The n-type semiconductor substrate 21 is doped at $10^{14}$ cm$^{-3}$ to $10^{15}$ cm$^{-3}$, and the p-type well 20 has dopant concentration ranging from $10^{15}$cm$^{-3}$ to $10^{16}$cm$^{-3}$. The depth of the p-type well 20 will be described hereinlater in connection with a junction type field effect transistor formed therein. A heavily doped p-type channel stopper region 22b is formed beneath the inner peripheral edge of the thick field oxide film 22a, and is grounded. The charge transfer device largely comprises a shift register 23 and an output circuit 24, and charge packets are supplied from photo-electric converting elements (not shown) to the shift register 23. The charge packets are conveyed through the shift register 23 to the output circuit 24, and the output circuit 24 produces an output voltage signal OUT indicative of the intensity of an image carrying light.

The shift register 23 comprises an n-type charge transfer region 23a formed in the p-type well 20, a thin gate oxide film 23b on the n-type charge transfer region 23a, transfer gate electrodes 23c partially overlapped with one another, and an output electrode 23d also partially overlapped with the final transfer electrode 23c, and the n-type charge transfer region 23b under the output electrode 23d serves as an output node of the shift register 23. The shift register 23 thus arranged is responsive to a multi-phase transfer clock signal applied to the transfer electrodes 23c and the output electrode 23d, and the charge packets are sequentially supplied from the output node under the output electrode 23d to the output circuit 24.

The output circuit 24 comprises a junction type field effect transistor 24a, a constant current source 24c, a junction type load transistor 24d coupled between the junction type field effect transistor 24a and the constant current source 24c, an output buffer circuit 24e coupled with the drain node of the junction type load transistor 24d for producing the output voltage signal OUT, and a reset transistor 24f coupled between the junction type field effect transistor 24a and the heavily doped p-type channel stopper region 22b. The constant current source 24c supplies current through the junction type load transistor 24d to the junction type field effect transistor at all times. When a charge packet is supplied from the output node of the shift register 23 to the junction type field effect transistor 24a, the current is modulated depending upon the amount of electric charges, and the modulated current varies the voltage level at the drain node of the junction type load transistor 24a. Since the amount of electric charges is indicative of the intensity of the image carrying light, the voltage level at the drain node is also indicative of the intensity of the image carrying light. The output buffer circuit 24e produces the output voltage signal OUT from the voltage level at the drain node of the junction type load transistor, and, accordingly, the output voltage signal OUT represents the intensity of the image carrying light.

The junction type field effect transistor 24a is formed in the p-type well 20, and comprises an n-type looped gate region 24g contiguous to the n-type charge transfer region 23a, a heavily doped source region 24h surrounded by the looped gate region 24g and, drain regions 24i contiguous to the heavily doped p-type channel stopper region 22b. The p-type well 20 beneath the looped gate region 24g serves as a channel region 24j of the junction type field effect transistor 24a, and a part 24k of the channel region 24j is shallower than remaining portion of the p-type well 20. For better understanding of the layout of the junction type field effect transistor 24a, the heavily doped p-type source region 24h, the drain regions 24i and the shallow part 24k are hatched in FIG. 4. In this instance, the n-type looped gate region 24g is doped at $10^{16}$cm$^{-3}$ to $10^{17}$cm$^{-3}$, and is 0.5 micron to 1.0 micron in depth. As described hereinbefore, the p-type well 20 is doped at $10^{15}$cm$^{-3}$ to $10^{16}$cm$^{-3}$. However, the channel region 24j is doped at $10^{14}$cm$^{-3}$ to $10^{15}$cm$^{-3}$. Although the p-type well 20 is as deep as 5 microns to 8 microns, the shallow part 24k is 2 to 4 microns, and is surely shallower than the remaining portion of the p-type well 20 such as a portion beneath the drain regions 24i.

Current flows into the source region 24g of the junction type field effect transistor 24a, and passes through the channel region 24j. The depletion layer extends from the p-n junction between the lopped gate region 24g into the channel region 24j, and provides resistance against the current. The current finally flows into the drain regions 24i and, accordingly, into the heavily doped channel stopper region 22b as drain current 24m of the junction type field effect transistor 24a. The charge packets have respective electric charges, and are varied with the intensity of the image carrying light. When a charge packet flows into the looped gate region 24g, the potential level in the looped gate region 24g is varied depending upon the amount of electric charge of the packet, and the depletion layer further extends into or retracts from the channel region 24j. As a result, the drain current 24m is modulated by the depletion layer depending upon the amount of electric charge, and affects the voltage level at the drain node of the junction type load transistor 24d. This results in the variation of the output voltage signal OUT. As described hereinbefore, the channel region 24j is not only shallower but also smaller in dopant concentration than the remaining portion of the p-type well 20, and the transconductance of the junction type field effect transistor 24a is increased. For this reason, this results in wide variation of voltage level at the drain node of the junction type load transistor 24d, and the output circuit 24 is improved in sensitivity to the charge packets.

The reset transistor 24f comprises a thin gate oxide film 24o, a reset electrode 24o and a p-type reset drain region 24p contiguous to the heavily doped channel stopper region 22a. Prior to introduction of a new electric package into the n-type looped gate region 24g, a reset signal is applied to the reset electrode 24o, and accumulated electric charges are discharged from the looped gate region 24g into the reset drain region 24p.

Figure 7A:
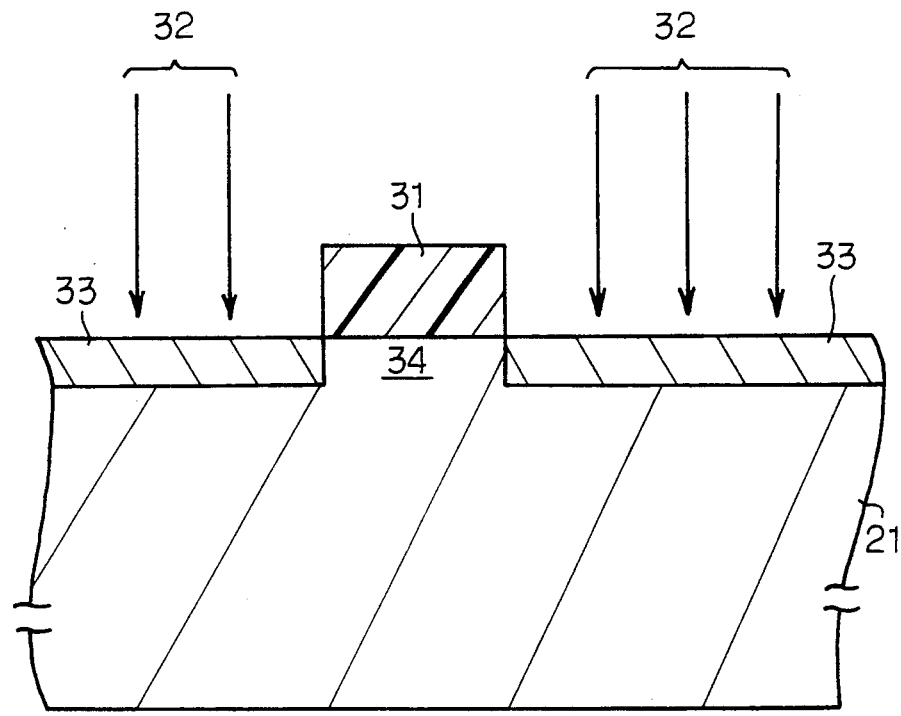
FIGS. 7A to 7B are cross sectional views showing essential stages of a process sequence according to the present invention.
Figure 7B:
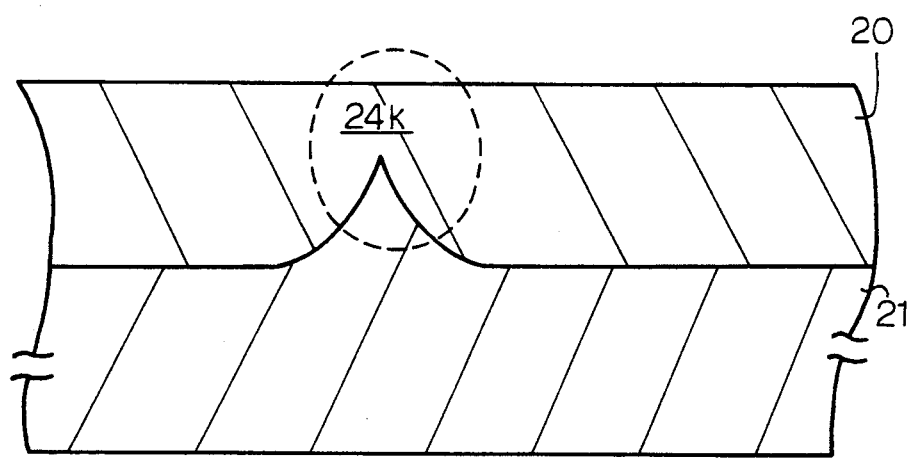

Description is hereinbelow made on essential stages of a process sequence for fabricating the charge transfer device shown in FIGS. 4 to 6 with reference to FIGS. 7A and 7B of the drawings. The process sequence starts with preparation of the n-type semiconductor substrate 21, and photoresist solution is spun onto the major surface of the n-type semiconductor substrate 21 for covering with a photoresist film. The photoresist film is patterned through a lithographic process so that a mask 31 is left on the major surface of the n-type semiconductor substrate 21. Boron 32 is ion implanted into the surface portion of the n-type semiconductor substrate 21, and heavily doped boron region 33 takes place in the surface portion of the n-type semiconductor substrate 21. However, the mask 31 protects a part 34 of the surface portion from the boron flux 32, and the resultant structure of this stage is illustrated in FIG. 7A.

The mask 31 is stripped off from the major surface of the n-type semiconductor substrate 21, and the resultant structure is placed in a furnace (not shown). The furnace heats the n-type semiconductor substrate 21 to a thousand several hundred degrees in centigrade, and the implanted boron is diffused into the n-type semiconductor substrate 21. Since the part 34 of the n-type semiconductor substrate 21 was not doped with the boron, the boron laterally diffused from the heavily doped boron region 33 is merged at the part 34 of the n-type semiconductor substrate 21, and forms the shallow part 24k in the p-type well 20 as shown in FIG. 7B.

Figure 8:
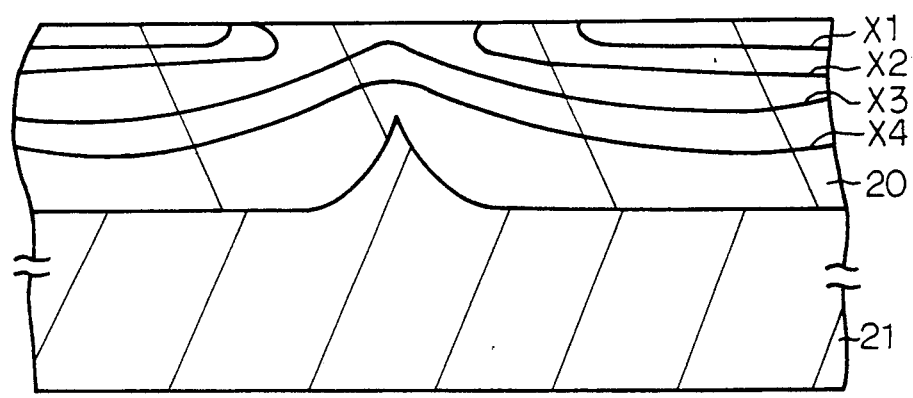
FIG. 8 is a cross sectional view showing the dopant profile of the p-type well formed through the process sequence.

The dopant profile of the p-type well 20 is illustrated in FIG. 8, and plots X1, X2, X3 and X4 are respectively indicative of the dopant concentrations of $1 \times 10^{16} cm^{-3}$, $5 \times 10^{15} cm^{-3}$, $1 \times 10^{15} cm^{-3}$ and $5 \times 10^{14} cm^{-3}$. The dopant profile in the shallow part 24k is dominated by the lateral diffusion of boron, and the dopant concentration thereof is smaller than the remaining portion of the well 20. Since the shallow part 24k is not only shallower but also smaller in dopant concentration than the remaining portion of the p-type well 20, the shallow part 41 produces larger resistance than a corresponding part of the remaining portion in so far as those parts occupy respective real estates equal to each other.

As will be understood from the foregoing description, the shallow part 24k increases the channel resistance of the junction type field effect transistor 24a, and improves the transconductance thereof. The junction type field effect transistor 24a thus improved in the transconductance enhances the sensitivity of the output circuit 24 to the charge packets.

Second Embodiment

Figure 9:
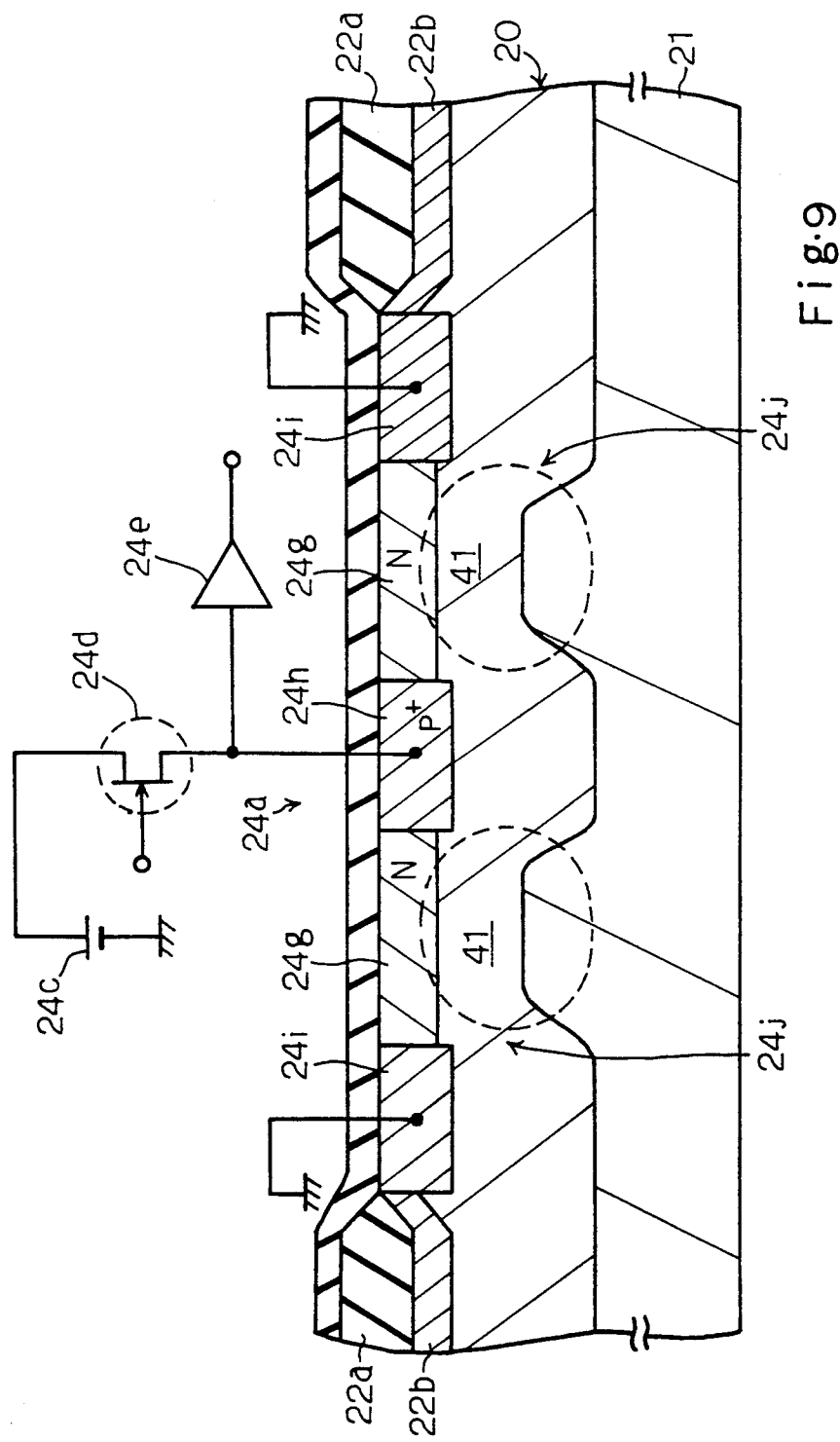
FIG. 9 is a cross sectional view showing the structure of another charge transfer device according to the present invention.

Turning to FIG. 9 of the drawings, a junction type field effect transistor incorporated in another charge transfer device embodying the present invention is illustrated from the same angle as the structure shown in FIG. 6, and the other component circuits of the charge transfer device are similar to those of the first embodiment. The charge transfer device implementing the second embodiment is different from the first embodiment in formation of a shallow channel region 41, and, for this reason, regions and films of the second embodiment are labeled with the same references designating the corresponding regions and films of the first embodiment without detailed description.

In the first embodiment, the diffusion stage after the ion implantation simultaneously forms the shallow part 24k. However, in the second embodiment, the p-type well 20 and the shallow part 41 are independently formed through respective processes. Namely, the deep p-type well 20 is formed through the ordinary process, and void area is left in the n-type semiconductor substrate 21. Thereafter, a p-type shallow well is formed in the void area, and is merged into the deep p-type well 20. Thus, the deep and shallow wells are formed in the n-type semiconductor substrate 21 through the respective processes, and the dopant concentration as well as the depth of the shallow part 41 are independently controllable. In other words, either dopant concentration or depth of the shallow part 41 may be different from the remaining part of the p-type well 20, and both dopant concentration and depth may be different from the remaining portion. This results in that the transconductance of the junction type field effect transistor 24a is exactly adjustable to a target value.

Third Embodiment

Figure 10:
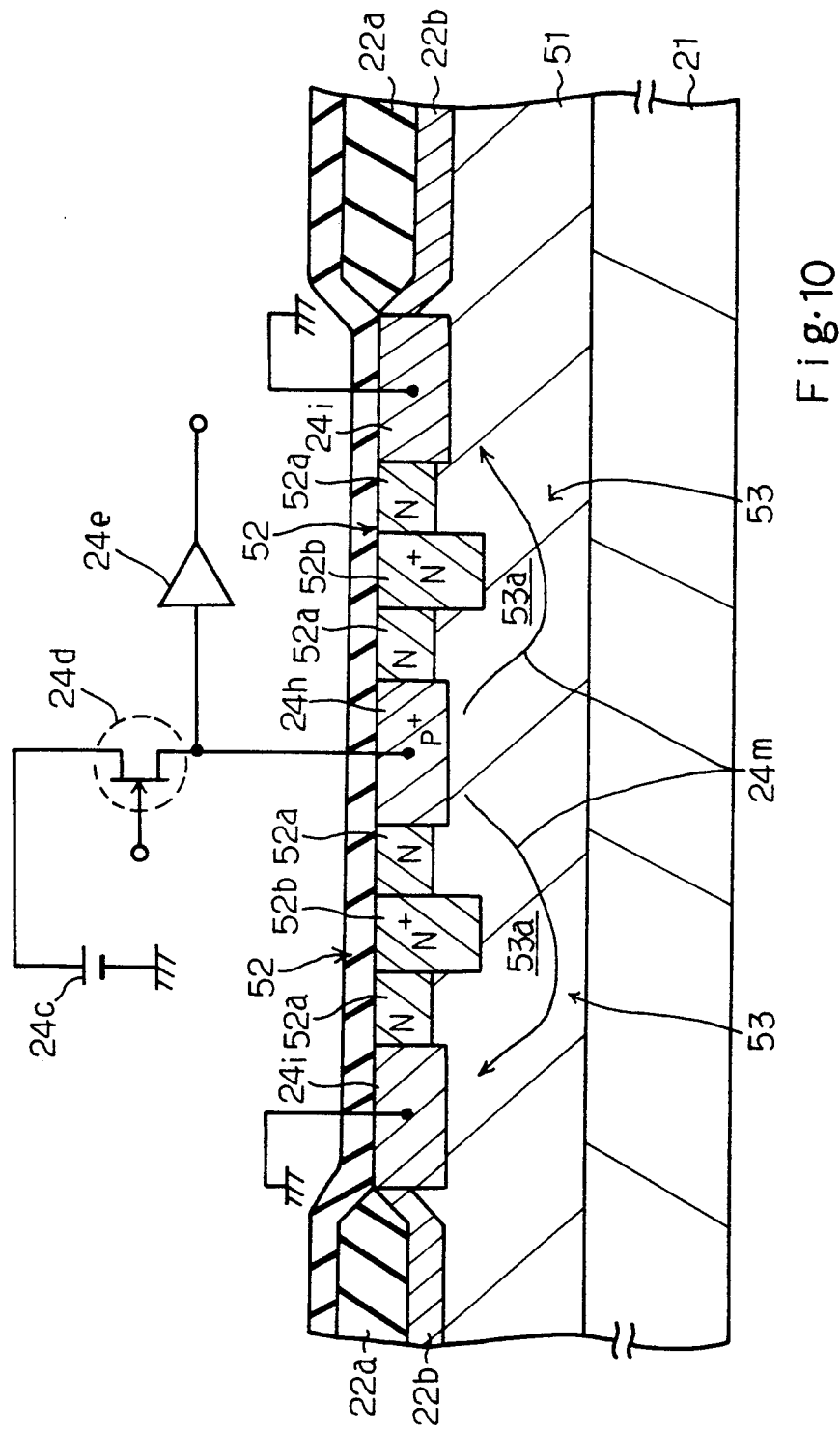
FIG. 10 is a cross sectional view showing the structure of a junction type field effect transistor incorporated in yet another charge transfer device according to the present invention.

Turning to FIG. 10 of the drawings, a junction type field effect transistor incorporated in yet another charge transfer device is illustrated from the same angle as FIG. 6, and the other component circuits of the charge transfer device are similar to those of the first embodiment. The junction type field effect transistor shown in FIG. 10 in turn is similar to the field effect transistor 24a except for a p-type well 51 as well as an n-type looped gate region 52. For this reason, description is focused upon the differences, and the other regions and films are labeled with the same references as the corresponding parts of the field effect transistor 24a without detailed description.

The p-type well 51 is substantially uniform in depth, and the n-type looped gate region 52 partially projects deep into the p-type well 51 so that a channel region 53 has a constricted portion 53a. Namely, the n-type looped gate region 52 has relatively shallow inner and outer peripheral portions 52a and a relatively deep central portion 52b, and the central portion 52b is larger in dopant concentration than the inner and outer peripheral portions 52a. The central portion 52b is located over the constricted portion 53a, and the distance between the central portion 52b and the bottom surface of the p-type well 51 is narrower than the distance between the drain region 24i and the bottom surface of the p-type well 51. Even if the p-type well 51 is uniform in the dopant concentration, the constricted portion 53a is larger in resistance than a corresponding portion occupying the same amount of real estate. Therefore, the channel region 53 produces larger resistance against the drain current 24m, and the junction type field effect transistor is improved in transconductance.

Figure 11:
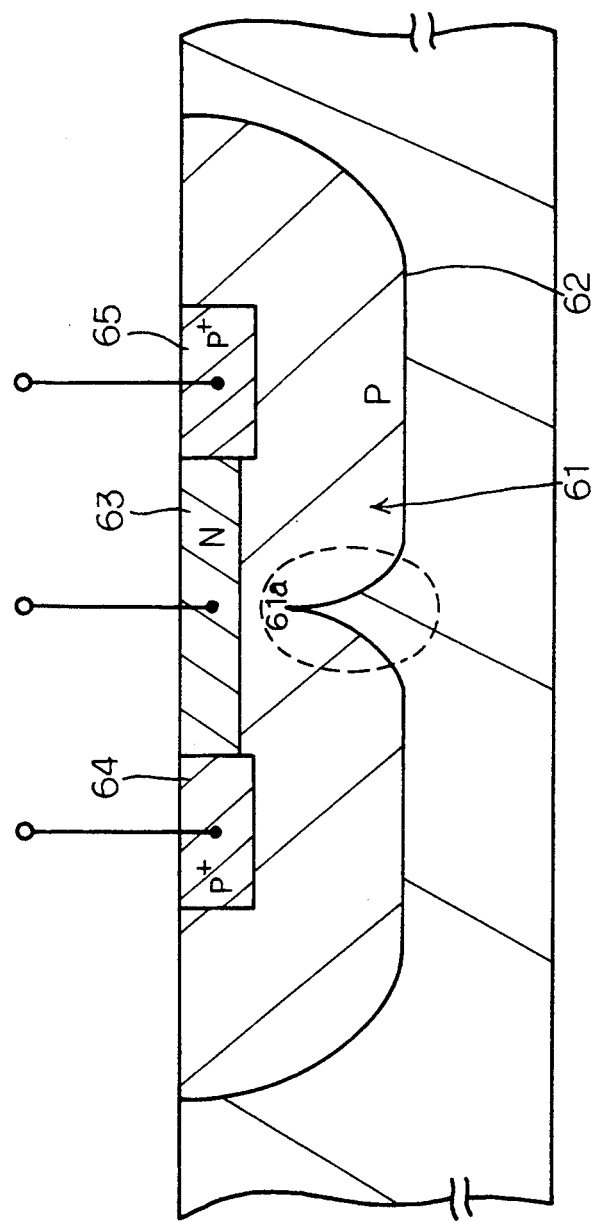
FIG. 11 is a cross sectional view showing the structure of a junction type load transistor replaceable with the load transistors incorporated in the charge transfer devices according to the present invention.

Although particular embodiments of the present invention have been shown and described, it will be obvious to those skilled in the art that various changes and modifications may be made without departing from the spirit and scope of the present invention. For example, the junction type load transistor 24d may have the structure shown in FIG. 11, and a channel region 61 formed in a p-type well 62 has a constricted portion 61a beneath a gate region 63 between source and drain regions 64 and 65 for increasing the channel resistance thereof.

What is claimed is:

1. A charge transfer device fabricated on a semiconductor substrate of a first conductivity type, comprising:
   a) a shift register having an output node, and responsive to a transfer clock signal for transferring charge packets to said output node; and
   b) an output circuit having b-1) a current source, b-2) a load means having an input node coupled with said current source, and b-3) a junction type field effect transistor coupled with an output node of said load means, and formed in a well of a second conductivity type opposite to said first conductivity type, said junction type field effect transistor having a gate region of said first conductivity type coupled with said output node of said shift register for allowing said charge packets to flow thereinto, a source region of said second conductivity type defined in said well, and coupled with said output node of said load means, a drain region of said second conductivity type defined in said well, and located in the opposite to said source region with respect to said gate region, and a channel region of said second conductivity type defined in said well beneath said gate region, and larger in resistance than a corresponding region in said well.

2. A charge transfer device as set forth in claim 1, in which said output circuit further comprises b-3) an output buffer circuit coupled with the output node of said load means for detecting voltage variation thereat.

3. A charge transfer device as set forth in claim 2, in which said output circuit further comprises b-4) a reset transistor having a channel region defined in said well, and contiguous to said gate region, a gate electrode provided over said channel region, and a reset drain region defined in said well and located in the opposite to said gate region with respect to said channel region of said reset transistor.

4. A charge transfer device as set forth in claim 1, in which said load means is implemented by a junction type field effect transistor.

5. A charge transfer device as set forth in claim 1, in which said channel region of said junction type field effect transistor is shallower than remaining portion of said well for providing the larger channel resistance.

6. A charge transfer device as set forth in claim 1, in which said channel region of said junction type field effect transistor is smaller in dopant concentration than remaining portion of said well for providing the large channel resistance.

7. A charge transfer device as set forth in claim 1, in which said channel region of said junction type field effect transistor is not only shallower but also smaller in dopant concentration than remaining portion of said well for providing the large channel resistance.

8. A charge transfer device as set forth in claim 1, in which said well is substantially uniform in depth, and said gate region has a deep portion and a shallow portion so as to provide the large channel resistance.

9. A charge transfer device fabricated on a semiconductor substrate of a first conductivity type, comprising:
   a) a shift register having an output node, and responsive to a transfer clock signal for transferring charge packets to said output node;
   b) an output circuit having b-1) a current source, b-2) a junction type load transistor having an input node coupled with said current source, b-3) an output buffer circuit coupled with an output node of said junction type load transistor for detecting voltage variation thereat, b-4) a junction type field effect transistor coupled with the output node of said junction type load transistor, and formed in a well of a second conductivity type opposite to said first conductivity type, said junction type field effect transistor having a looped gate region of said first conductivity type coupled with said output node of said shift register for allowing said charge packets to flow thereinto, a source region of said second conductivity type defined in said well, and surrounded by said looped gate region, said source region being coupled with said output node of said load means, a drain region of said second conductivity type defined in said well, and located in the outside of said looped gate region, and a channel region of said second conductivity type defined in said well beneath said looped gate region, and not only shallower but also smaller in dopant concentration than remaining region of said well for providing large channel resistance, and b-5) a reset transistor coupled with said gate region for discharging the charge packets accumulated therefrom.

10. A charge transfer device fabricated on a semiconductor substrate of a first conductivity type, comprising:
   a) a shift register having an output node, and responsive to a transfer clock signal for transferring charge packets to said output node;

b) an output circuit having b-1) a current source, b-2) a junction type load transistor having an input node coupled with said current source, b-3) an output buffer circuit coupled with an output node of said junction type load transistor for detecting voltage variation thereat, b-4) a junction type field effect transistor coupled with the output node of said junction type load transistor, and formed in a well of a second conductivity type opposite to said first conductivity type, said junction type field effect transistor having a looped gate region of said first conductivity type coupled with said output node of said shift register for allowing said charge packets to flow thereinto, a source region of said second conductivity type defined in said well, and surrounded by said looped gate region, said source region being coupled with said output node of said load means, a drain region of said second conductivity type defined in said well, and located in the outside of said looped gate region, and a channel region of said second conductivity type defined in said well beneath said looped gate region, and shallower than remaining region of said well for providing large channel resistance, and b-5) a reset transistor coupled with said gate region for discharging the charge packets accumulated therefrom.

11. A charge transfer device fabricated on a semiconductor substrate of a first conductivity type, comprising:
   a) a shift register having an output node, and responsive to a transfer clock signal for transferring charge packets to said output node;
   b) an output having b-1) a current source, b-2) a junction type load transistor having an input node coupled with said current source, b-3) an output buffer circuit coupled with an output node of said junction type load transistor for detecting voltage variation thereat, b-4) a junction type field effect transistor coupled with the output node of said junction type load transistor, and formed in a well of a second conductivity type opposite to said first conductivity type, said junction type field effect transistor having a looped gate region of said first conductivity type coupled with said output node of said shift register for allowing said charge packets to flow thereinto, a source region of said second conductivity type defined in said well, and surrounded by said looped gate region, said source region being coupled with said output node of said load means, a drain region of said second conductivity type defined in said well, and located in the outside of said looped gate region, and a channel region of said second conductivity type defined in said well beneath said looped gate region, and smaller in dopant concentration than remaining region of said well for providing large channel resistance, and b-5) a reset transistor coupled with said gate region for discharging the charge packets accumulated therefrom.

12. A charge transfer device fabricated on a semiconductor substrate of a first conductivity type, comprising:
   a) a shift register having an output node, and responsive to a transfer clock signal for transferring charge packets to said output node;
   b) an output circuit having b-1) a current source, b-2) a junction type load transistor having an input node coupled with said current source, b-3) an output buffer circuit coupled with an output node of said junction type load transistor for detecting voltage variation thereat, b-4) a junction type field effect transistor coupled with the output node of said junction type load transistor, and formed in a well of a second conductivity type opposite to said first conductivity type, said junction type field effect transistor having a looped gate region of said first conductivity type coupled with said output node of said shift register for allowing said charge packets to flow thereinto, a source region of said second conductivity type defined in said well, and surrounded by said looped gate region, said source region being coupled with said output node of said load means, a drain region of said second conductivity type defined in said well, and located in the outside of said looped gate region, and a channel region of said second conductivity type defined in said well beneath said looped gate region, and having a constricted portion due to a portion of said looped gate region projecting into said well deeper than the remaining portion of said looped gate region as well as than said drain region for providing the large channel resistance, and b-5) a reset transistor coupled with said gate region for discharging the charge packets accumulated therefrom.

* * * * *